United States Patent [19]
Lazarus et al.

[11] Patent Number: 5,314,782
[45] Date of Patent: May 24, 1994

[54] DEEP UV SENSITIVE RESISTANT TO LATENT IMAGE DECAY COMPRISING A DIAZONAPHTHOQUINONE SULFONATE OF A NITROBENZYL DERIVATIVE

[75] Inventors: Richard M. Lazarus, Mission Viejo; Thomas A. Koes, Riverside, both of Calif.

[73] Assignee: Morton International, Inc., Chicago, Ill.

[21] Appl. No.: 26,934
[22] Filed: Mar. 5, 1993
[51] Int. Cl.$^5$ .................. G03F 7/023; G03F 7/30
[52] U.S. Cl. ................... 430/165; 430/190; 430/191; 430/192; 430/193; 430/270; 430/271; 534/557
[58] Field of Search ............. 430/190, 191, 192, 193, 430/165, 270, 271; 534/556, 557

[56] References Cited

U.S. PATENT DOCUMENTS

| | | | |
|---|---|---|---|
| 2,772,972 | 12/1956 | Herrick, Jr. et al. | 96/33 |
| 3,046,121 | 7/1962 | Schmidt | 96/33 |
| 3,494,767 | 2/1970 | Laridon et al. | 430/192 |
| 3,779,778 | 12/1973 | Smith et al. | 96/115 R |
| 3,915,706 | 10/1975 | Limburg et al. | 96/27 R |
| 4,273,668 | 6/1981 | Crivello | 252/182 |
| 4,311,782 | 1/1982 | Buhr et al. | 430/270 |
| 4,467,025 | 8/1984 | Goto et al. | 430/191 |
| 4,477,553 | 10/1984 | Yamamoto et al. | 430/190 |
| 4,491,628 | 1/1985 | Ito et al. | 430/176 |
| 4,632,900 | 12/1986 | Demmer et al. | 430/323 |
| 4,678,737 | 7/1987 | Schneller et al. | 430/270 |
| 4,963,463 | 10/1990 | Koshiba et al. | 430/191 |
| 5,037,721 | 8/1991 | Doessel | 430/270 |
| 5,068,163 | 11/1991 | Elsaesser et al. | 430/192 |
| 5,073,474 | 12/1991 | Schwalm et al. | 430/192 |
| 5,151,340 | 9/1992 | Tadros | 430/193 |
| 5,178,986 | 1/1993 | Zampini et al. | 430/190 |

FOREIGN PATENT DOCUMENTS 217211 7/1983 Fed. Rep. of Germany ...... 534/556

OTHER PUBLICATIONS

Nalamasu et al.; *Effect of Post-Exposure Delay in Positive Acting Chemically Amplified Resists: An Analytical Study;* Regional Technical Conference of the Mid-Hudson Section of the Society of Plastics Engineers; Oct., 1991.

Przybilla et al.; *t-BOC Blocked Hydroxyphenyl-Meth-a-crylates: On the Way to Quarter Micron Deep-UV Lithography;* Regional Technical Conference of the Mid-Hudson Section of the Society of Plastics Engineers; Oct. 1991.

Houlihan et al; *Phase transfer catalysis in the tert-butyloxycarbonylation of alcohols, phenols, enols, and thiols with di-tert-butly dicarbonate;* Can. J. Chem., 63 (1985).

Reichmanis et al., *The Effect of Substituents on the Photosensitivity of 2-Nitro-benzyl Ester Deep U.V. Resists,* J. Electrochem, Jun. 1983 (vol. 130, No. 6).

Reichmanis et al., *A Study of the Photochemical Response of o-Nitrobenzyl Cholate Derivatives in P(MMA-MAA) Matrices,* Journal of Polymer Science, Polymer Chemistry Edition, vol. 21, (1983).

Reichmanis et al., *o-Nitrobenzyl Photochemistry: Solution vs. Solid-State Behavior,* Journal of Polymer Science, Polymer Chemistry Edition, vol. 23 (1985).

Reichmanis et al., *A novel approach to o-nitrobenzyl photochemistry for resists,* J.Vac.Sci. Technol.,Nov./Dec. 1981.

Tarascon et al., *Poly(t-BOC-styrene sulfone)-Based Chemically Amplified Resists for Deep-UV Lithography,* AT&T Bell Laboratories.

Frechet et al., *Polycarbonates Derived from o-Nitrobenzyl Glycidyl Ether: Synthesis and Radiation Sensitivity,* Dept. of Chemistry, Univ. of Ottawa, Ontario IBM Research Laboratory, San Jose, California.

*Primary Examiner*—Charles L. Bowers, Jr.
*Assistant Examiner*—John S. Chu
*Attorney, Agent, or Firm*—Robert M. Didrick; Gerald K. White

[57] ABSTRACT

A positive working deep UV sensitive photoresist which provides improved critical dimension stability during prolonged periods of post exposure delay before baking comprises an acid stable polymer which is insoluble in water but normally soluble in an aqueous alkaline medium, a photo acid generator exemplified by the tri-(2,1,4-diazonaphthoquinonesulfonate) ester of 3,5-dinitro-2,6-dimethylol para cresol, and a mixed carbonate ester of tertiary butyl alcohol and a polyhydric phenol which is an acid labile compound which inhibits the dissolution of the normally soluble polymer in said alkaline medium.

21 Claims, No Drawings

DEEP UV SENSITIVE RESISTANT TO LATENT IMAGE DECAY COMPRISING A DIAZONAPHTHOQUINONE SULFONATE OF A NITROBENZYL DERIVATIVE

FIELD OF THE INVENTION

This invention relates to a deep ultra-violet radiation sensitive composition which contains a polymeric binder which is insoluble in water but normally soluble in aqueous alkaline media, an acid labile organic compound which inhibits the dissolution of the binder in aqueous alkaline but which decomposes in contact with an acid, and a novel photo acid generator which chemically amplifies the sensitivity of the composition upon exposure to actinic radiation. The composition is particularly suitable as a positive working photoresist wherein the exposed portions are rendered soluble or developable by deep UV radiation and can be removed with selective developing solutions while the unexposed portions remain intact. Thus imagewise exposure of the composition and development yields an image corresponding to the original image.

BACKGROUND OF THE INVENTION

The sensitivity of photolithographic systems based on diazonaphthoquinone sensitized novolac resins is limited by the quantum efficiency of the sensitizer to photoproduct conversion. It is too low for practical use in deep UV work because of the very low power that is available from exposure sources in those wavelengths. A dramatic increase in sensitivity in radiation-sensitive systems, often referred as chemical amplification, is obtained when a species produced in the primary photoreaction independently initiates a catalytic secondary reaction, thus increasing the quantum yield to valuesabove one. For example, systems which photochemically produce a strong acid which then cleaves acid labile groups in a secondary reaction are disclosed in U.S. Pat. No. 3,915,706 for positive working polyaldehydes.

Radiation sensitive mixtures which contain, as a binder, a polymer which is soluble in aqueous alkaline media, a compound which forms a strong acid by a photochemical reaction, and another compound which possesses acid cleavable C—O—C bonds and whose solubility in a liquid developer is increased by the action of acid are disclosed in U.S. Pat. No. 4,678,737.

Photosolubilizable compositions which are readily removable by developing solutions in areas exposed to actinic radiation are taught in U.S. Pat. No. 3,779,778. That composition comprises a water-insoluble organic compound containing one or more acid degradable linkages of the general formula

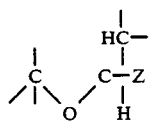

wherein Z may be —OAr, among others, and a photolyzable acid progenitor which upon exposure to actinic radiation generates an acidic condition.

U.S. Pat. No. 4,311,782 shows a radiation sensitive mixture which contains an acid forming compound and a polymeric compound having recurrent orthocarboxylic acid ester groupings for the production of positive relief images.

U.S. Pat. No. 5,037,721 has taught a positive radiation sensitive mixture that exhibits no change in the development time whether the time between irradiation and development is long or short, and provides high structural resolution of the developed resist that is retained during processing steps subsequent to the development. Said mixture comprises a compound which forms an acid under the action of actinic radiation and a particular type of monomeric acid-cleavable compound which contains an acetal group. This patent has a good discussion of the acid-cleavable materials which had been employed already, and it is incorporated herein by reference for that purpose. Neither the '721 patent nor those mentioned therein, however, address the problem of latent image decay, which causes critical dimensions (CD) to change in the time between the exposure and the post exposure bake step, which is performed before development.

U.S. Pat. No. 4,491,628 shows a deep UV sensitive resist composition which is made by combining a polymer having recurrent acid labile pendant groups, e.g., poly (p-tert-butoxycarbonyloxy-α-methylstyrene), with a cationic photoinitiator such as a triarylsulfonium hexafluoroantimonate.

Such compositions are taught there to be particularly useful and advantageous when used with deep UV light (200–300nm) because they give very high resolution images with nearly vertical wall angles even in films thicker than 2 microns.

Latent image decay is the most critical problem in chemical amplification systems for imaging semiconductors. In a paper presented at the Regional Technical Conference of the Mid-Hudson Section of the Society of Plastics Engineers in October of 1991 by Nalamasu et al. and entitled *Effect of Post-Exposure Delay in Positive Acting Chemically Amplified Resists: An Analytical Study*, it was said, "For TBSS/PAG resist formulations, it is crucial to post exposure bake the material immediately after exposure in order to achieve acceptable linewidth control." TBSS is a modified acronym for poly t-butoxycarbonyloxystyrenesulfone and PAG is an acronym for photoacid generators. In another paper presented at that conference, and entitled *t-BOC Blocked Hydroxyphenyl-Meth- acrylates:On the Way To Quarter Micron Deep-UV Lithography*, Przybilla et al. said that virtually no increase in dose-to-clear and influence on structure quality was observed for delay intervals of up to 20 minutes in a t-BOC system when a sulfonic acid generator such as triphenylsulfonium triflate is used but that a more severe dependence on the time between exposure and post exposure bake was observed when onium salts with complex fluorides such as antimony hexafluoride as the counter ion were used as the acid generator. The Nalamasu et al. paper and the Przybilla et al. paper are each incorporated herein by reference.

Such onium salts are not entirely satisfactory, moreover, because contamination of the silicon substrate of semiconductor chips by the heavy metal ions of said onium salts degrades the electrical properties of the chips. Also, the disposal of waste streams containing said metal ions is severely regulated. They are also quite complex to make and are very expensive.

There is a need, therefore, for a new and different photoresist composition whose sensitivity to actinic radiation may be chemically amplified by the interaction of a binder which is normally soluble in an alkaline aqueous medium, a non-onium photo acid generator, and a discrete acid labile inhibitor of the dissolution of the binder.

SUMMARY OF THE INVENTION

It is an object of this invention to provide new, chemically amplified photoresist compositions.

It is an object of this invention, therefore, to provide a positive working deep UV sensitive resist which demonstrates improved CD stability during prolonged hold times between exposure of the resist and the post exposure bake.

It is a related object of this invention to provide a CD stable, deep UV sensitive photoresist whereby the overall yield of the photolithographic process for manufacturing semiconductors and the like is improved.

It is another object of this invention to provide a deep UV sensitive recording material comprising a layer of the photoresist on a substrate.

It is another object of this invention to provide a method for producing an imaged recording material by deep UV radiation.

It is yet another object of this invention to provide a method for producing an imaged recording material by actinic radiation of a photoresist composition chemically amplified by the new photo acid generator.

These an other objects which will become apparent from the following description of the invention are achieved by a positive photoresist composition comprising an acid stable polymer which is insoluble in water but normally soluble in an aqueous alkaline medium; a mixed carbonate ester of tertiary butyl alcohol and a polyhydric phenol which is an acid labile compound which inhibits the dissolution of the normally soluble polymer in said alkaline medium; and a photo acid generator having the formula:

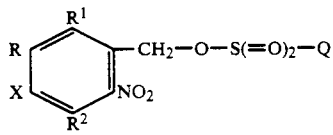

wherein Q is a diazonaphthoquinione moiety; R is hydrogen or the —CH$_2$—OS(=O)$_2$—Q moiety; R$^1$ is hydrogen, hydroxyl, or —O—S(=O)$_2$—Q; R$^2$ is hydrogen or lower alkyl; X is hydrogen or a nitro group, with the proviso that R$^2$ is lower alkyl when X is a nitro group.

DETAILED DESCRIPTION OF THE PREFERRED EMBODIMENTS

Suitable substrates for the recording materials are all materials used for condensers, semiconductors, multilayer printed circuit boards, or integrated circuits. In particular, substrates having surfaces which are made of thermally oxidized and/or aluminum coated silicon material, which may be doped, are suitable along with other substrates which are customary in semiconductor technology such as silicon nitride, gallium arsenide, and indium phosphide. In addition, substrates known in the manufacture of liquid crystal displays such as glass, indium/tin oxide, metal plates and foils made of aluminum, copper or zinc, for example, and bimetallic and trimetallic foils are suitable.

In the method for the production of the deep UV sensitive recording material, a solution of the photoresist is applied on the substrate by spraying, roller-coating, flow coating, dip coating, or by spin coating. The solvent is then removed in a soft bake step in which the temperature of the substrate and resist may be raised as high as 140° C. for up to about 90 seconds. The resulting film is then exposed imagewise to actinic radiation having a wavelength of from 200 to 300 nm, preferably from about 240 to about 270 nm. UV lamps which emit radiation at such wavelengths at an intensity of about 0.5 to about 60 mW/cm$^2$ are suitable. An Oriel brand contact printer working at a wavelength of about 254 nm and an excimer laser-powered deep UV stepper at about 248 nm, such as is available under the trademark GCA, are representative of exposure systems suitable for this invention. In the portions of the film on which the radiation falls, the radiation causes the release of acid from the photoinitiator and the acid labile dissolution inhibitor begins to decompose in the presence of the acid. The exposed resist is baked at temperatures up to about 120° C. in order to accelerate the decomposition of the acid labile inhibitor. This post baking step may be delayed for as long as about 2 hours or even longer if necessitated by the production schedule without changing the critical dimensions of the image which is subsequently revealed by treating the film with a developer to dissolve the resist which has regained its solubility in alkaline media by the decomposition of the dissolution inhibitor.

Solutions of alkaline reagents such as the silicates, metasilicates, hydroxides, hydrogen phosphates, dihydrogen phosphates, carbonates, and hydrogen carbonates of alkaline metals or ammonia are suitable as the developer. Quaternary ammonium hydroxides such as the NMD-3 tetramethylammonium hydroxide and the like are also useful as developers. The concentration of these bases in the aqueous developer solution is from about 0.1% to about 15% by weight, preferably from 0.5% to about 5% by weight of the solution.

The acid stable, water-insoluble binder may be a poly-(p-hydroxystyrene), a poly(p-hydroxy-α-methylstyrene), a polymer made from homologs of the respective monomers therein having alkyl substituents on the benzene ring or a mixture thereof to provide the desired solubility in commercial developers while maintaining an optical transparency to deep UV radiation that is similar to that offered by the unsubstituted poly(p-hydroxy styrene). It is called acid stable to reflect the absence of acid labile groups such as that known as the "t-boc" or t-butyloxycarbonyloxy group. The polymer is of moderate molecular weight of from about 5000 to about 30,000, preferably about 15,000 or less. The amount of the binder is generally from about 55% to about 85%, preferably from about 65% to about 80% by weight of the solids in the resist.

Preferred among the photo acid generators of this invention are those wherein R$^1$ is —O—S(=O)$_2$—Q; R$^2$ is lower alkyl; and X is a nitro group. R$^2$ is preferably a methyl group. Examples of PAG's of this invention include the tri-(2,1,4-diazonaphthoquinonesulfonate) ester of 3,5-dinitro-2,6-dimethylol para cresol and its 2,1,5-homolog. Both the 2,1,4- and 2,1,5- homologs are sometimes referred to hereinafter as the respective NMC triester. Other examples include the 2,1,4- and 2,1,5- diazonaphthoquinone sulfonate ester of 2-nitro benzyl alcohol. The concentration of the photo acid generator is from about 1% to about 20% of the total weight of solids in the resist. The weight ratio of said acid generating photoinitiator to the acid labile dissolution inhibitor is from about 0.1:1 to about 1.6:1, preferably from about 0.4:i to about 1.1:1.

The acid labile dissolution inhibitor, being a mixed carbonate ester of tertiary butyl alcohol and a polyhydric phenol, does contain the "t-boc" group. The polyhydric phenol to which the t-boc group is attached is exemplified by pyrogallol, resorcinol, catechol, hydroquinone, phloroglucinol, hydroxyhydroquinone, trihydroxy- and tetrahydroxybenzophenone, and the acetone/pyrogallol condensation products represented by the line formula

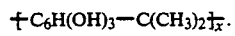

wherein x is from 2 to about 12 or the fused ring structure of hexahydroxyspirobiindene. The concentration of the acid labile dissolution inhibitor is from about 8% to about 18% of the total weight of solids in the resist. The inhibitor may be prepared by the base-catalyzed alcoholysis of di-t-butyl carbonate, a well known procedure, with the selected polyhydric phenol in an amount such that from about 10% to 100% of the hydroxyl groups are protected by a t-butyloxycarbonyloxy substituent. Fast, high yield reactions of equimolar amounts of phenols and di-t-butyl carbonate in tetrahydrofuran, ethyl acetate, or dichloromethane at 0° C. to about room temperature in the presence of a catalytic amount of 18-crown-6 and an equivalent amount of powdered potassium carbonate are described by Houlihan et al. in a paper entitled: *Phase transfer catalysis in the tert-butyloxycarbonylation of alcohols, phenols, enols, and thiols with di-tert-butyl dicarbonate*, in Can. J. Chem. 63, 153, (1985). The use of less than 0.1% of 4-N,N-dimethylamino-pyridine as the catalyst in THF also gives good yields.

Improved image quality is achieved by the addition of from about 8% to about 18% by weight of the solids in the total composition of the product obtained from the reaction of 2-diazo-1-naphthoquinone-4-sulfonyl chloride (2,1,4 DNQ) or its structural homolog, 2,1,5 DNQ, with a novolac resin from the condensation of a cresol and formaldehyde. The 2,1,4-DNQ coupled resins are preferred. Mixtures of coupled products utilizing the two homologs are contemplated for the purposes of this invention. A preferred novolac resin is derived from p-cresol.

To aid in the application of the resist to the substrate, the photoresist mixture of this invention is usually dissolved in solvents such as ethylene glycol, and ethers thereof, e.g., the monomethyl, monoethyl, and dimethyl ether; propylene glycol monoalkyl ethers; aliphatic esters such as ethyl lactate, hydroxyethyl acetate, alkoxyethyl acetate, propylene glycol monomethyl ether acetate; other ethers such as dioxane; ketones, including methyl ethyl ketone, methyl isobutyl ketone, cyclopentanone, and cyclohexanone; dimethylformamide, dimethylacetamide, butyrolactone, and tetrahydrofuran, among others, and in admixtures. The glycol ethers and aliphatic esters, such as ethyl lactate and propylene glycol monomethyl ether acetate are particularly preferred.

Additives such as dyes, pigments, plasticizers, wetting agents, adhesion promoters, and flow-control agents may be incorporated in the photoresist of this invention in order to improve specific properties such as attenuation of reflective effects, sensitivity, flexibility, and the like.

The solutions of the photoresist as applied to the substrate generally have a solids content of from about 20% to about 50% by weight of the solution, and preferably from about 20% to about 0%.

BEST MODE FOR CARRYING OUT THE INVENTION

The invention is illustrated in more detail by way of the following examples.

Preparation of Intermediates

All parts in these preparative methods and in the working examples are by weight unless otherwise stated.

Potassium carbonate (1.1 equivalents) was added to a solution of pyrogallol (1 equivalent) in tetrahydrofuran and the mixture was stirred for one-half hour. Di-tert-butyl carbonate (1.1 equivalents) was then added and the reaction mixture was stirred overnight (about 12 hours) at room temperature (about 20°-25° C). An equal volume of tetrahydrofuran was added and the mixture was filtered. The filtrate was neutralized with glacial acetic acid and then concentrated to one-fourth of its volume under vacuum. The concentrate was poured into an excess of water with vigorous agitation. A slurry formed and this was filtered to isolate the t-Boc capped pyrogallol which was used in Examples 1 and 2.

Preparation of 3,5-dinitro-2,6-dimethylol-p-cresol

To 67.2 parts (0.4 mole) of 2,6-dimethylol-p-cresol (PMC Specialties Group, PMC, Inc., Cincinnati) in 1500 parts of deionized water in a reaction vessel there was added 100 parts of a 70.7% aqueous solution of nitric acid (1.12 moles) over a period of 5 minutes with vigorous stirring at room temperature. The reaction mixture was stirred vigorously at room temperature for 8 hours and then was quiescent for about 16 hours before being stirred again for 2 hours. The mixture was then filtered through a Büchner funnel with the aid of a vacuum. The wetcake was washed with de-ionized water until a pH of the filtrate was about 4 to 5 and then it was dried in a vacuum dessicator at room temperature. The yield was 74 parts which is 71.2% of the theoretical yield.

Preparation of NMC Triester

The tri-(2,1,4-diazonaphthoquinonesulfonate) ester of 3,5-dinitro-2,6-dimethylol para cresol was made by adding 4.22 parts (0.016 equivalent) of 2,1,4-diazonaphthoquinone sulfonyl chloride to 1.35 parts (0.0155 equivalent) of 3,5-dinitro-2,6-dimethylol para cresol and lowering the temperature to 0° C. Then a solution of 1.60 parts of triethylamine in 70.4 parts of propyleneglycol monomethyl ether was added to the mixture while maintaining the temperature within the range of 0° to about 10° C. The esterification was allowed to proceed in this temperature range for 4 hours and the reaction mixture was added to deionized water acidified with hydrochloric acid while vigorously stirring the water. The product precipitated from the water and was separated on a Büchner funnel by vacuum filtration. Water washing and vacuum drying of the filter cake gave 4.90 parts (98%) of the desired product. A $C_{13}$ NMR analysis of the product showed that essentially all of the diazo chloride had reacted.

Preparation of 1-naphthalene sulfonic acid, 3-diazo-3,4-dihydro-4-oxo-ester of a cresol/formaldehyde resin To 110 parts of tetrahydrofuran there was added 43.3 parts of the cresol/formaldehyde novolak resin and the solution was filtered. To the filtrate was added 38.4 parts of the 2,1,4 DNQ mentioned above and the reaction mixture was stirred at a moderate rate as 19.0 parts of N,N-diethyl- ethanolamine was added at such a rate as to keep the pH below 6.0 and the temperature in the range of 25°-30° C. When all of the base has been added, the pH is allowed to rise to 7 and hold there for 5 minutes whereupon 2 parts of concentrated hydrochloric acid are added in one charge. After 15 minutes of mixing at room temperature, the mixture is added over a 15 minute period to 4 liters of rapidly agitated dilute hydrochloric acid. The resulting slurry is filtered and the residue is washed with deionized water. The wet cake is dried at room temperature in a vacuum. The product is hereinafter called 2,1,4-DNQ/(cresol/formaldehyde).

Procedure for Making a Photoresist Coated Silicon Wafer

Hexamethyldisilazane was deposited as an adhesion promoter on a 4-inch diameter silicon wafer and spread out evenly by spinning the wafer at 2000 rpm for 5 seconds and then at 5000 rpm for 15 seconds. The products of Examples 1 and 2 were then spread evenly over separate silicon wafers by spinning each wafer at 3000 rpm for 5 seconds and at 6000 rpm for another 15 seconds. After softbaking at 80° C./60 seconds, the coatings had a thickness of 1.0±0.02 microns. The photoresist coatings were then exposed imagewise to actinic radiation at a wavelength of 365nm by a GCA 0.40 NA stepper. A post exposure bake at 90° C./60 seconds was used to produce relief structures A and B, respectively. When developed in 0.6% TMAH, the gross clearing speed of Structures A and B was 75.8 mJ/cm$^2$ and the percent film loss was 3 in each case. The gross clearing speed of Structure B when developed in 1.2% TMAH was 36.2 mJ/cm$^2$ and the film loss was

| EXAMPLES 1 & 2 | | |
|---|---|---|
| | AMOUNT | |
| COMPONENT | 1 | 2 |
| Poly(hydroxystyrene) resin (Maruzen 5000) | 15.18 | 8.72 |
| t-BOC capped pyrogallol | 3.02 | 3.02 |
| 2,1,4-DNQ/(cresol/formaldehyde) | 2.52 | 5.04 |
| NMC triester | 7.28 | 11.21 |
| Troykyd 366 | 0.05 | 0.05 |
| Ethyl lactate | 27.38 | 42.19 |
| Propylene glycol monomethyl ether acetate | 44.58 | 29.78 |

EXAMPLE 3

The preparation of the 2,1,4-diazonaphthoquinone sulfonyl ester of 2-nitrobenzyl alcohol was carried out according to the general procedure for making the NMO triester except for the substitution of an amount of 2-nitrobenzyl alcohol equivalent to the amount of 2,1,4-diazonaphthoquinone sulfonyl chloride.

EXAMPLE 4

A photosensitive resist composition containing 16.12% of a novolac resin (m-,p-cresol/formaldehyde; mol. wt.: 5000 daltons); 3.02% of the t-Boc ester of pyrogallol (95% esterified), 3.69% of the product of Example 8, 0.05% of Troykyd 366 film forming agent, and 77.12% of propylene glycol monomethyl ether acetate was spin coated onto silicon wafers to give a 1 micron thick film when dried. The coated wafers were then irradiated with patterned deep UV light, post-exposure baked, and developed in aqueous tetramethyl ammonium hydroxide (NMD-3) to give images having good sidewall profiles. In some cases, the post-exposure bake was delayed for 3 hours while the irradiated resist was subjected to hexamethyldisilazane (HMDs) vapors. Latent image decay was not observed.

The subject matter claimed is:

1. A positive working photoresist composition comprising, in admixture:
   a polymer insoluble in water but normally soluble in an aqueous alkaline medium; a photo acid generator having the formula

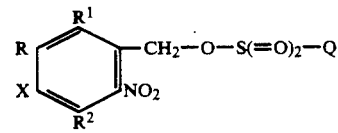

wherein Q is a diazonaphthoquinone moiety; R is hydrogen or the $-CH_2-OS(=O)_2-Q$ moiety; $R^1$ is hydrogen, hydroxyl, or $-O-S(=O)_2-Q$; $R^2$ is hydrogen or lower alkyl; and X is hydrogen or a nitro group, with the proviso that $R^2$ is lower alkyl when X is a nitro group; and
   a mixed carbonate ester of tertiary butyl alcohol and a polyhydric phenol which is a discrete acid labile inhibitor of the dissolution of the polymer insoluble in water but normally soluble in aqueous alkaline medium.

2. The composition of claim 1, wherein R, $R^1$, $R^2$, and X are hydrogen.

3. The composition of claim 1 wherein $R^1$ is $-O-S(=O)_2-Q$; $R^2$ is lower alkyl; and X is nitro group .

4. The composition of claim 1 wherein the photo acid generator is the tri-(2,1,4-diazonaphthoquinonesulfonate) ester of 3,5 -dinitro-2,6-dimethylol para cresol.

5. The composition of claim 1 further comprising a 1-naphthalene sulfonic acid, 3-diazo-3,4-dihydro-4-oxo ester of a cresol/formaldehyde polymer.

6. The composition of claim 1 wherein the polyhydric phenol is pyrogallol.

7. The composition of claim 1 wherein the polyhydric phenol is a product of the condensation of acetone and pyrogallol.

8. The composition of claim 7 wherein the polyhydric phenol is hexahydroxyspirobiindene.

9. A radiation sensitive composition comprising, in admixture:
   a photo acid generator having the formula:

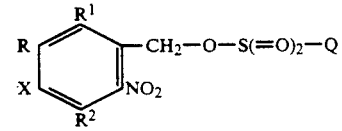

wherein Q is a diazonaphthoquinone moiety; R is hydrogen or the $-CH_2-OS(=O)_2-Q$ moiety; $R^1$ is hydrogen, hydroxyl, or $-O-S(=O)_2-Q$; $R^2$ is hydrogen or lower alkyl; X is hydrogen or a nitro group, with the proviso that R² is lower alkyl when X is a nitro group; and an acid labile carbonate ester of tertiary butyl alcohol and a polyhydric phenol.

10. The composition of claim 9 wherein the polyhydric phenol is pyrogallol.

11. The composition of claim 9 wherein R is the —CH₂—OS(=O)₂—Q moiety.

12. The composition of claim 9 wherein R¹ is —O—S(=O)₂—Q; R² is lower alkyl; and X is a nitro group.

13. The composition of claim 1 wherein the carbonate ester if from about 3% to about 5% by weight of the total weight.

14. The composition of claim 5 wherein the amount of the oxo ester is from about 3% to about 5% by weight of the total.

15. A radiation sensitive recording material which comprises a support and a recording layer thereon, said recording layer comprising, in admixture:

an acid stable polymer insoluble in water but normally soluble in an aqueous alkaline medium; a photo acid generator having the formula:

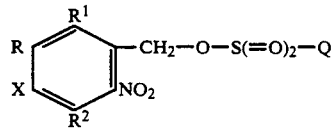

wherein Q is a diazonaphthoquinone moiety; R is hydrogen or the —CH₂—OS(=O)₂—Q moiety; R¹ is hydrogen, hydroxyl, or —O—S(=O)₂—Q; R² is hydrogen or lower alkyl; X is hydrogen or a nitro group, with the proviso that R² is lower alkyl when X is a nitro group; and a mixed carbonate ester of tertiary butyl alcohol and a polyhydric phenol.

16. The recording material of claim 15 wherein the polyhydric phenol is pyrogallol.

17. The recording material of claim 15 wherein the polyhydric phenol is a condensation product of acetone and pyrogallol.

18. The recording material of claim 15 wherein R is the —CH₂—OS(=O)₂—Q moiety.

19. The recording material of claim 15 wherein R¹ is —O—S(=O)₂—Q; R² is lower alkyl; and X is a nitro group.

20. The recording material of claim 15 wherein the photo acid generator is the tri-(2,1,4-diazonaphthoquinonesulfonate) ester of 3,5-dinitro-2,6-dimethylol para cresol.

21. The composition of claim 1 wherein the polyhydric phenol is selected from the group consisting of pyrogallol, resorcinol, catechol, hydroquinone, phloroglucinol, hydroxyhydroquinone, trihydroxybenzophenone, and tetrahydroxybenzophenone.

* * * * *